United States Patent
Jibbe et al.

(10) Patent No.: US 9,111,598 B2
(45) Date of Patent: Aug. 18, 2015

(54) INCREASED I/O RATE FOR SOLID STATE STORAGE

(71) Applicant: NetApp, Inc., Sunnyvale, CA (US)

(72) Inventors: Mahmoud K. Jibbe, Wichita, KS (US); Gary M. Gaston, Wichita, KS (US)

(73) Assignee: NetApp, Inc., Sunnyvale, CA (US)

( * ) Notice: Subject to any disclaimer, the term of this patent is extended or adjusted under 35 U.S.C. 154(b) by 66 days.

(21) Appl. No.: 14/028,142

(22) Filed: Sep. 16, 2013

(65) Prior Publication Data

US 2015/0078111 A1   Mar. 19, 2015

(51) Int. Cl.
| | |
|---|---|
| *G11C 7/00* | (2006.01) |
| *G11C 7/10* | (2006.01) |
| *G11C 16/34* | (2006.01) |
| *G06F 11/10* | (2006.01) |
| *G11C 13/00* | (2006.01) |
| *G06F 12/02* | (2006.01) |

(52) U.S. Cl.
CPC .......... *G11C 7/1006* (2013.01); *G06F 11/1068* (2013.01); *G06F 12/0246* (2013.01); *G11C 13/0069* (2013.01); *G11C 13/0097* (2013.01); *G11C 16/3445* (2013.01)

(58) Field of Classification Search
CPC ............ G06F 12/0246; G06F 11/1068; G11C 13/0069; G11C 13/0097; G11C 16/3445
USPC ........... 365/185.11, 185.29, 189.011, 189.04, 365/189.16, 218, 230.03, 231, 185.003, 365/189.14, 230.04
See application file for complete search history.

(56) References Cited

U.S. PATENT DOCUMENTS

| | | | |
|---|---|---|---|
| 2012/0233384 A1* | 9/2012 | Charles et al. | 711/103 |
| 2013/0051144 A1* | 2/2013 | Suzuki | 365/185.11 |
| 2014/0211561 A1* | 7/2014 | Li | 365/185.03 |
| 2014/0219024 A1* | 8/2014 | Ogi et al. | 365/185.11 |
| 2015/0003157 A1* | 1/2015 | Aritome | 365/185.11 |

FOREIGN PATENT DOCUMENTS

KR   1020130075221   *   6/2013

* cited by examiner

*Primary Examiner* — Fernando Hidalgo
(74) *Attorney, Agent, or Firm* — Gilliam IP PLLC

(57) ABSTRACT

The storage device receives a write request from a disk controller to write data to a storage array. The storage device determines that one or more blocks are marked for deletion. In response to receiving the write request and determining that blocks are marked for deletion, the storage device issues a write command on a first media access channel for a first location of the storage array, and issues an erase command on a second media access channel for a different storage location of the storage array. Thus, the commands are issued concurrently on different channels.

18 Claims, 8 Drawing Sheets

INCREASED I/O RATE FOR SOLID STATE STORAGE

FIELD

Embodiments described are related generally to storage device access, and embodiments described are more particularly related to a storage device providing concurrent write and erase commands in response to a write request.

COPYRIGHT NOTICE/PERMISSION

Portions of the disclosure of this patent document can contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below. Copyright © 2013, NetApp, Inc., All Rights Reserved.

BACKGROUND

The longer a storage device is used, the amount of free, unwritten space decreases. The decrease of free, unwritten space is especially true in storage devices used in data centers or other network-accessed shared storage architectures. When the storage device is a solid state drive (SSD), the decrease in free, unwritten space causes the performance of the device to decrease. The performance decrease is accounted for because the SSD must erase the space necessary for the new data prior to writing the data. The extra delay in writing the data reduces throughput performance.

Traditionally, a write to an SSD or other storage device that requires erasing prior to writing, includes a host system sending data to a disk controller or comparable controller device. The disk controller separates the data into blocks for storage on the storage devices, and issues a write command to the storage device itself. The storage device executes local firmware to determine how to store the data on the physical medium of the storage device. Traditional firmware includes the following conditions:

If the data is not edited data, and there are adequate free pages on the storage device, the local controller writes the data directly to the media;

If the data is not edited data, and there are not adequate free pages on the storage device, the local controller obtains address(es) of block(s) marked for deletion, and erases the block(s). Only after the completing the erase function, the local controller writes the new data to the newly erased pages;

If the data is edited data, and there are adequate free pages on the storage device, the local controller reads the original data, modifies the original data with the new data, and writes the modified data to the free pages on the media. The local controller then marks the old pages for deletion; and If the data is edited data, and there are not adequate free pages on the storage device, the local controller reads the original data and modifies the original data with the new data. The local controller obtains address(es) of block(s) marked for deletion, and erases the block(s). Only after completing the erase function, the local controller writes the modified data to the newly erased pages. The local controller then marks the old pages for deletion.

The delay created by the requirement to erase pages prior to performing a write when there are not adequate free pages can become a significant performance bottleneck in a data storage subsystem having a heavy access load, such as a data center.

BRIEF DESCRIPTION OF THE DRAWINGS

The following description includes discussion of figures having illustrations given by way of example of implementations of embodiments described. The drawings should be understood by way of example, and not by way of limitation. As used herein, references to one or more "embodiments" are to be understood as describing a particular feature, structure, or characteristic included in at least one implementation. Thus, phrases such as "in one embodiment" or "in an alternate embodiment" appearing herein describe various embodiments and implementations, and do not necessarily all refer to the same embodiment. However, they are also not necessarily mutually exclusive.

Figure 1:
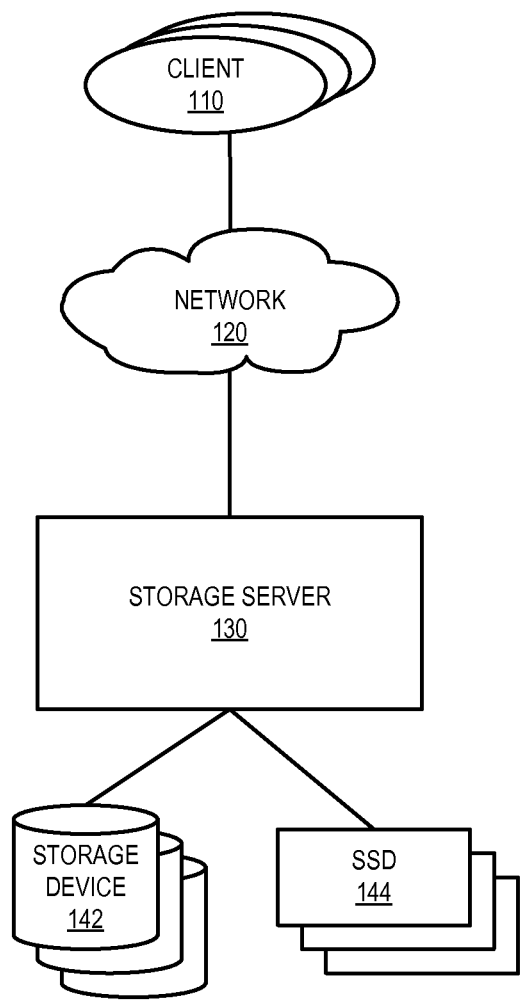
FIG. 1 is a block diagram of an embodiment of a system in which a drive issues concurrent write and erase commands in response to a write request.

Descriptions of certain details and embodiments follow, including a description of the figures, which can depict some or all of the embodiments described below, as well as discussing other potential embodiments or implementations of the technology presented herein.

DETAILED DESCRIPTION

A storage device generates parallel or concurrent write and erase commands in response to a received write request. The storage device can write the data in response to the request, and erase blocks marked for deletion to free storage space for subsequent write requests. The erase operation does not need to immediately precede the write operation. The concurrent erasure of blocks marked for deletion increases the likelihood that a storage device will have free storage space available whenever a write request is received.

The storage device receives a write request from a disk controller or comparable controller device to write data to a storage array. The storage device determines that one or more blocks are marked for deletion. In response to receiving the write request and determining that blocks are marked for deletion, the storage device issues a write command on a first media access channel for a first location of the storage array, where the first location is either unwritten space or erased space. The storage device also issues an erase command on a second media access channel for a different storage location of the storage array to erase the block(s) marked for deletion. Thus, the commands are issued concurrently on different channels.

It will be understood that "concurrent" commands or parallel commands refers to commands that do not require completion of each other prior to being executed. In traditional systems where a block is required to be erased prior to being written, the local controller is required to suspend a write command until completion of an erase command of the address space on which the write command will execute. As described in more detail below, a local controller does not have to wait for completion of either the write or erase command prior to executing the other command. It will be understood that a write command refers to a command by a local controller to commit data to the physical media (a storage array) of the storage device to which the local controller belongs. An erase command refers to a command by a local controller to reset a state of a location (e.g., block or blocks) of the physical media. For example, an erase command can include setting all bits of a particular address range to zeros. The commands are generated within the local controller in response to a request or command from external to the storage device by an external controller device (e.g., a disk controller).

The use of concurrent commands allows a storage device to avoid delay in a situation that would otherwise incur delay to erase a block prior to writing new data to the previously written blocks. Writing new data to a previously written block can be referred to as "overwriting" the block, which can include dual operations of first clearing the block of previous data, and then writing the new data to it. A common example of a storage device that requires erasing prior to overwriting is a solid state storage device or solid state drive (SSD). A host system, such as a user computer device, a server device, a storage server, or other host system, includes a device controller (e.g., a disk controller or comparable controller device to issue access requests to a storage device). The device controller sends a write request to the storage device, which determines if one or more blocks are marked for deletion, and issues a write command in response to the write request. The storage device also issues an erase request as a concurrent command to erase a location already marked for deletion, which is not a location to which the write command will write data. Thus, the two command operate on different blocks, which allows the write command to proceed without having to wait for completion of the erase command.

FIG. 1 is a block diagram of an embodiment of a system in which a drive issues concurrent write and erase commands in response to a write request. System 100 includes multiple clients 110 coupled over network 120 to storage server 130. Clients 110 can represent user devices and/or processes executed remotely that request a service of storage server 130.

In system 100, clients 110 access the storage system including storage server 130 and associated storage devices over network 120. Network 120 can include any internetworking technology to remotely access storage. Network 120 can include any combination of private and public network. In one embodiment, network 120 includes a fibre channel SAN (storage area network). In one embodiment, network 120 includes an iSCSI (small computer system interface over internet) network. In an alternative embodiment, clients 110 can be executed as different processes (e.g., different applications) on a host computer device, which host device can be directly attached directly to storage devices (e.g., a JBOD or just a bunch of drives implementation).

Storage server 130 represents a device that interfaces via network 120 to process and requests to a storage subsystem. The storage subsystem includes multiple storage devices 142. In one embodiment, storage subsystem includes multiple SSDs 144. It will be understood that SSDs 144 could be referred to as storage devices of the storage subsystem. SSDs 144 are separately identified in system 100 as one example of a storage device that requires erasing previously written blocks prior to writing new data to the previously written blocks.

As the storage devices of the storage subsystem are used longer, the amount of free space decreases until the storage device eventually performs writes by freeing up storage space prior to writing. As mentioned above, traditionally the storage device performs the erasing or freeing up of storage space immediately prior to performing the write. However, the erase operation decreases the performance of the storage device with respect to throughput, or data input/output (I/O) rates. In contrast, in system 100, SSDs 144 perform write and erase operations concurrently on separate access channels to different locations of the physical media in response to a write request. Thus, a write request results in the desired writing of data, and can also free up space for a subsequent write.

In one embodiment, storage server 130 includes a driver that divides data into 512 KB chunks for writing to the storage subsystem. In one embodiment, SSDs 144 erase 256 KB blocks as soon as a complete block is marked for deletion, and will erase 512 KB blocks when available as soon as they are marked for deletion. In one embodiment, each SSD 144 includes a local controller that determines when blocks are marked for deletion. Thus, the SSD marks blocks for deletion as soon as they are ready for deletion. Additionally, the local controller can issue concurrent commands to cause a write on one channel of an SSD 144 while issuing an erase on a different channel of the SSD 144. It will be understood that such concurrent operation can be performed independently by the storage devices themselves, without request or command by an external device controller.

Figure 2:
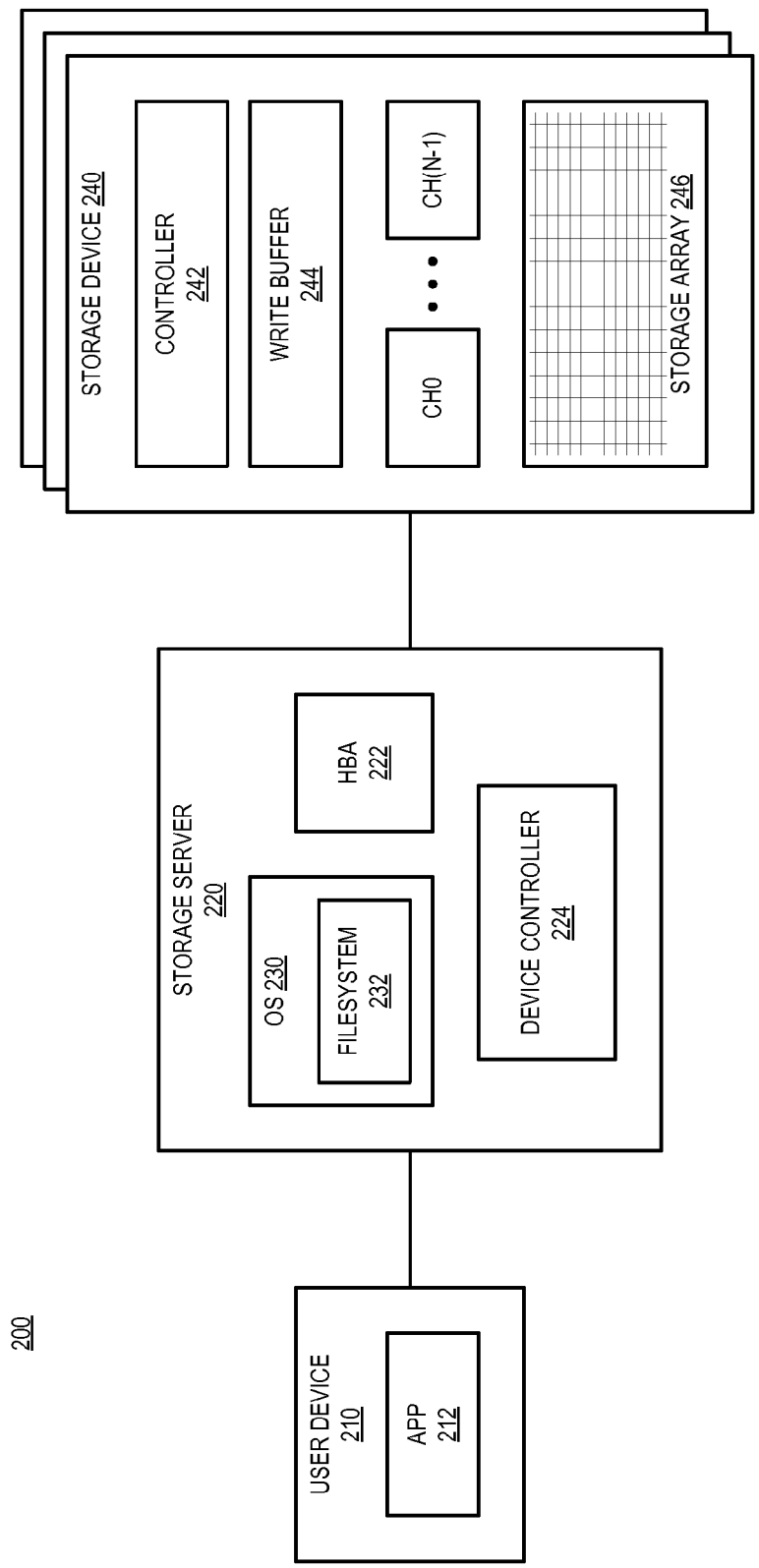
FIG. 2 is a block diagram of another embodiment of a system in which a drive issues concurrent write and erase commands in response to a write request.

FIG. 2 is a block diagram of another embodiment of a system in which a drive issues concurrent write and erase commands in response to a write request. System 200 provides one example of a system in accordance with system 100 of FIG. 1. While system 200 illustrates user device 210 and storage server 220, it will be understood that in an alternate embodiment, a user device 210 can include components necessary to directly connect to storage devices, and implement the operations described here for storage server 220.

User device 210 includes application (app) 212, which represents an end-user application (one with a user interface), or a system-level application that generates a data access request. A data access request can include a write request. Application 212 generates a write request to store new data to the storage devices and/or to modify data already stored on a storage device. In one embodiment, user device 210 sends a data access request to storage server 220 for access to storage device or drive 240. In one embodiment, user device 210 sends the data access request to storage server 220 over a network connection.

Storage server 220 includes operating system (OS) 230. OS 230 represents control software to manage the storage server and its operations. OS 230 includes filesystem 232, which manage how data is stored in the connected storage devices. Filesystem 232 can be a block-based filesystem, which stores and manages data in blocks, which are not necessarily contiguously stored within storage device 240. In one embodiment, storage server 220 includes HBA (host bus adapter) 222, which allows storage server 220 to interface with storage device 240. Storage server 220 includes a hardware interface to drive 240, and a driver to operate the hardware interface. HBA 222 can represent the driver used to interface with storage device 240. HBA 222 can separate a write operation generated by application 212 into multiple packets of operations for access to storage device 240. In one embodiment, HBA provides the packets of data to device controller 224.

Storage server 220 includes device controller 224, which represents a disk controller or comparable device. Device controller 224 is an external controller from the perspective of storage device 240. Device controller 224 generates data access requests to storage device 240. Device controller 224 can include driver components and physical interface components to send data access requests to storage device 240. Device controller 224 includes hardware interface components to connect to storage device 240, and storage device 240 includes hardware interface components to connect to device controller 224.

Storage device 240 includes controller 242, which is a local controller, or control logic local to the storage device. Controller 242 performs operations in response to receiving requests from device controller 224. More particularly, local controller 242 issues commands within the storage device to provide the requested access for application 212. For a write request, controller 242 issues one or more commands necessary to execute the write operation, as well as issuing a command to perform an erase operation on and blocks currently marked for deletion. The one or more commands to execute the write operation can depend on a state of the storage within storage device 240. For example, a single command may be sufficient to execute a write of new data when free space is available; whereas multiple commands may be required for a modification of existing data (e.g., read the data, modify the data, and then write the data).

In one embodiment, storage device 240 includes write buffer 244, where controller 242 can store data for a write request. Write buffer 244 can be or include any type of storage device, register, or buffer used to temporarily cache data. Thus, data received from device controller 224 in one or more write requests can be stored in write buffer 244 until stored on the physical media of storage device 240. Storage array 246 represents the physical media of storage device 240. Typically the storage space in an SSD is arranged in rows and columns, and thus is a storage array. Those of skill in the art are familiar with the structure and accessing of the physical media, and details will not be provided herein. Storage device 240 includes multiple channels to access storage array 240, as shown by N channels CH0 through CH(N−1). Each of the N channels is a storage access channel, or a channel over which local controller 242 can access storage array 240.

In operation, application 212 generates and/or modifies data. The generation or modification of data triggers filesystem 232 to generate a write request, which it forwards to HBA 222. HBA 222 processes the data associated with the request into packets of data to transmit to storage device 240. HBA 222 forwards the data packets to device controller 224. Device controller 224 transports the data to storage device 240. In one embodiment, device controller 224 transports the data as SCSI write commands. In one embodiment, storage device 240, via controller 242, breaks down a single write command received from device controller 224 into multiple blocks for delivery to the physical media, storage array 246. The multiple blocks can be, for example, 512 KB byte blocks delivered to the media.

In one embodiment, storage device 240 stores data arranged in blocks of 4 KB pages. In one embodiment, storage device 240 uses 64 pages per block, making the size of the block 256 KB. In one embodiment, storage device 240 uses 128 pages per block, making the size of the block 512 KB. Storage device 240 writes the data to storage array 246 using free pages. The free pages can be pages that are unwritten, until there are no more unwritten pages, after which storage device 240 writes the data to erased pages. If data that is already stored to storage device is later edited, controller 242 first reads the data from storage array 246, modifies the data, and rewrites the data to a different location of the physical media. The new location is typically mapped to the same logical address (e.g., logical block address (LBA)) as the original location from which the data was read. Controller 242 also generates a concurrent erase of blocks marked for deletion on a different channel. Thus, the erase is performed as a separate process asynchronously with respect to the write. The controller further marks the blocks at the original location for deletion.

In one embodiment, the number N of data access channels is two. In such an implementation, a storage device would issue a write command on one channel, and issue an erase command on the other channel. In one embodiment, the number N of data access channels is a multiple of two higher than two. In such an implementation, in one embodiment, the local controller can issue pairs of write and erase commands in parallel on different pairs of data access channels.

Figure 3:
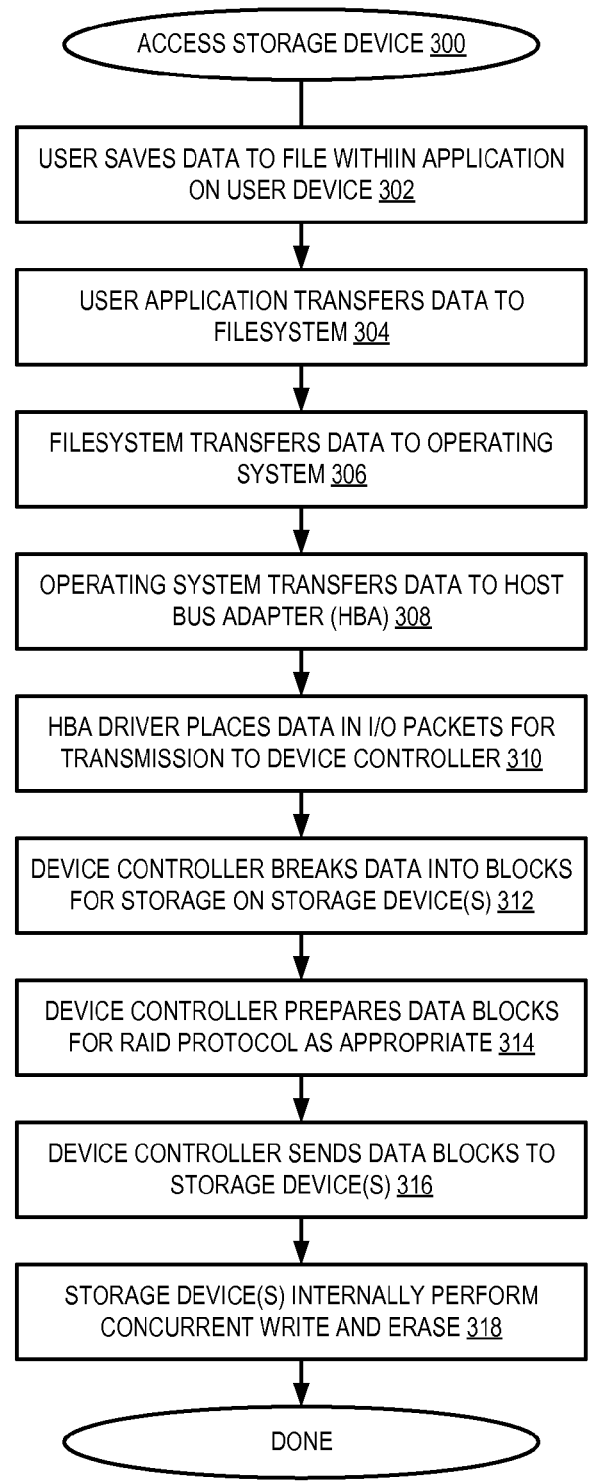
FIG. 3 is a flow diagram of an embodiment of a process for accessing a storage device that implements concurrent write and erase operations.

FIG. 3 is a flow diagram of an embodiment of a process 300 for accessing a storage device that implements concurrent write and erase operations. A user, either human or machine, enters and saves data to a file within an application on a user device, block 302. The user application transfers the data to the filesystem of an operating system under which the user application operates, block 304. The filesystem in turn transfers the data to the operating system, block 306. More particularly, the operating system includes services and/or processes for accessing storage.

The operating system transfers the data to a host bus adapter (HBA) or comparable host interface, block 308. The HBA driver places the data in I/O packets for transmission to a device controller (e.g., disk controller), block 310. The device controller includes a driver that further processes the data for storage by the storage device. The device controller breaks the data packets up into blocks for storage on the storage device(s), block 312. In one embodiment, the device controller prepares the data blocks for a RAID implementation, as appropriate, block 314. The device controller then sends the data blocks to the storage device(s), block 316.

The storage device(s) receive the data from the device controller, and internally perform concurrent write and erase operations in response to receiving the data, block 318. The internal nature of the concurrent write and erase operations refers to the fact that the storage device(s) manage the concurrent operations internally, and the concurrent commands are not managed by the device controller. For example, the storage device includes an internal controller that can generate a data write operation on a first channel (e.g., channel A), and an erase operation on a second channel (e.g., channel B). The operations are discussed below in more detail with respect to FIGS. 4A and 4B, respectively.

Figure 4A:
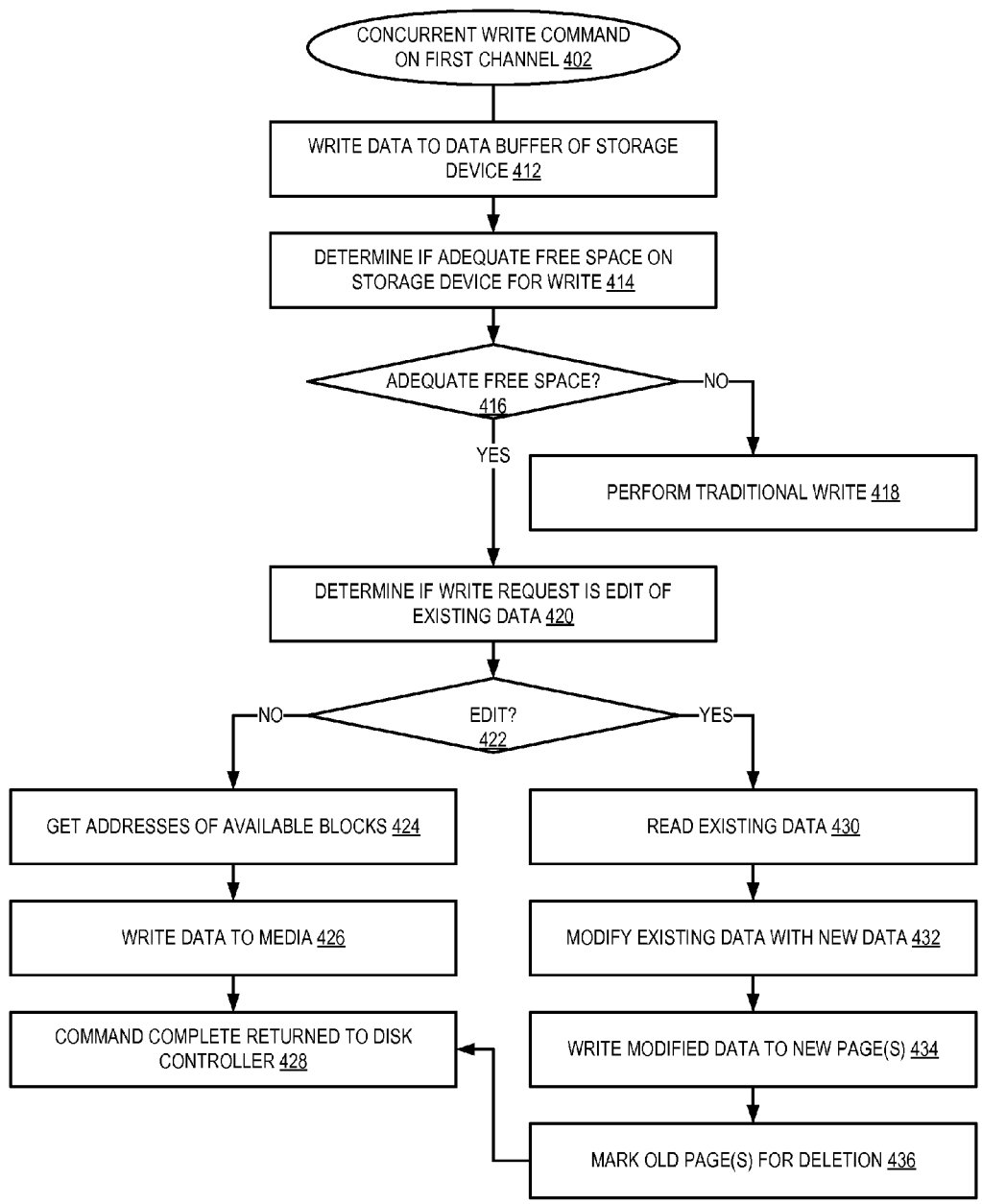
FIG. 4A is a flow diagram of an embodiment of a process for implementing a write on channel A concurrently with an erase on channel B as provided in FIG. 4B.

A local controller of the storage device determines when a write operation is required, and in response to the need for a write operation initiates process 402 of FIG. 4A to execute a concurrent write on a first channel. The local controller also checks for blocks marked for deletion in response to receiving a write request, and initiates process 404 of FIG. 4B to execute a concurrent erase on a second channel. It will be understood that the local controller issues the write command to a first location of the storage media, and issues the erase command to a second location of the storage media. Thus, the storage device writes to one location and erases a different location in parallel.

Figure 4B:
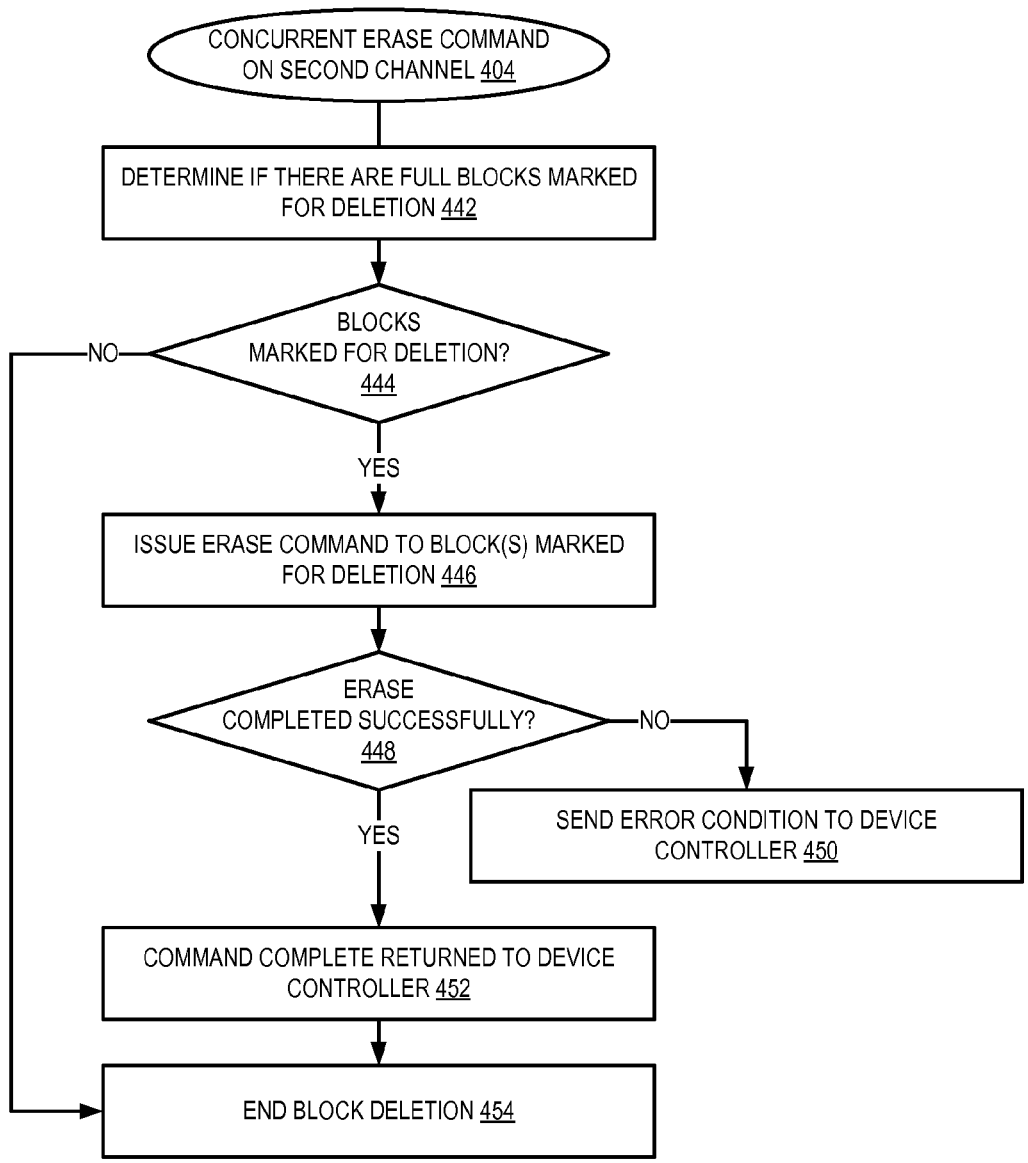
FIG. 4B is a flow diagram of an embodiment of a process for implementing an erase on channel B concurrently with a write on channel A as provided in FIG. 4A.

FIG. 4A is a flow diagram of an embodiment of a process 402 for implementing a write on channel A concurrently with an erase on channel B as provided in FIG. 4B. In one embodiment, the local controller of the storage device writes the data to a data buffer, block 412. The local controller determines if there are adequate free pages on the storage device to fulfill the write request, block 414. In one embodiment, if there are not adequate free pages on the storage device for the write, block 416 NO branch, the local controller performs write operations in accordance with traditional methods, block 418. More particularly, the local controller will perform an erase operation directly preceding a write operation to the same location. Thus, the local controller will free up storage space immediately preceding a write operation, and can perform an erase operation and a write operation on the same channel, or on separate channels to the same storage location.

If there are adequate free pages on the storage device to fulfill the write request, block 416 YES branch, the local controller determines if the write request is for a new data, or if it is an edit of existing data, block 418. The data edit will identify the storage location of the data to be modified. If the write operation is not for a data edit, block 420 NO branch, the local controller can obtain the address(es) of available blocks, block 422. The available blocks are blocks that are either unwritten, or erased and therefore reset to an unwritten state. The local controller issues a command to write the data to selected available blocks, block 424. The local controller can return a command complete signal to the device controller after completing the write operation, block 426.

If the write operation is for a data edit, block 420 YES branch, the local controller reads the existing data corresponding to the data to modify from a specified address for the data to modify, block 428. The local controller modifies the existing data with the new data, block 430, and writes the modified data to new page(s) on the storage media, block 432. The local controller marks the pages that contain the original data for deletion. The local controller can send a command complete signal to the device controller after completing the write operation, block 426.

FIG. 4B is a flow diagram of an embodiment of a process 404 for implementing an erase on channel B concurrently with a write on channel A as provided in FIG. 4A. In parallel with the write operation, the local controller (e.g., disk firmware) checks to see if an erase operation can be performed in parallel. Thus, the local controller determines if there are full blocks marked for deletion, block 442. In one embodiment, the local controller will only perform a parallel erase on full blocks (e.g., 256 KB or 512 KB) that are marked for deletion. If there are no blocks marked for deletion, block 444 NO branch, the block deletion process ends, block 454.

If there are blocks marked for deletion, block 444 YES branch, the local controller issues an erase command to the block or blocks marked for deletion, block 446. It will be understood that a block will be marked for deletion from a previous operation that deleted and/or moved data. A delete operation marks a block for deletion. A modification of data includes modifying the data and performing a delete operation on the original data location.

If the erase operation does not complete successfully, block 448 NO branch, the local controller can send an error condition to the device controller, block 450. If the erase operation completes successfully, block 448 YES branch, the local controller can send a command complete signal to the device controller, block 452. The local controller then terminates the block deletion operation, block 454.

Figure 5A:
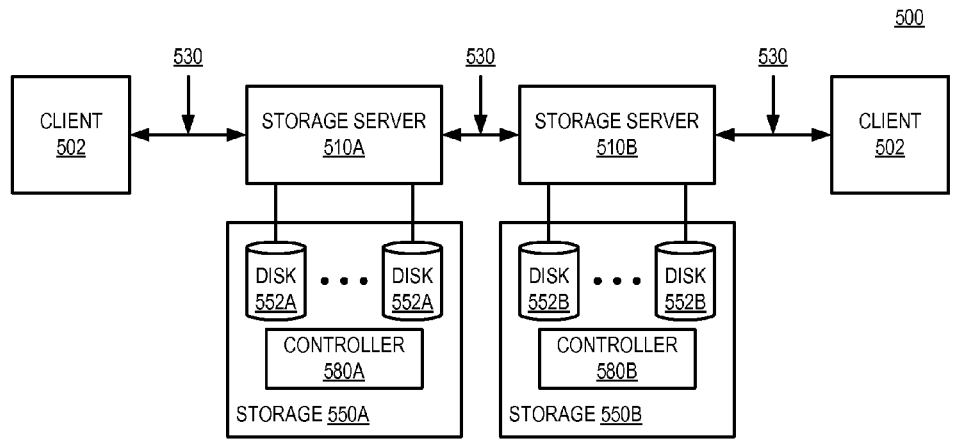
FIG. 5A illustrates a network storage system in which concurrent write and erase can be implemented.

FIG. 5A illustrates a network storage system in which concurrent write and erase can be implemented. Storage servers 510 (storage servers 510A, 510B) each manage multiple storage units 550 (storage 550A, 550B) that include mass storage devices. These storage servers provide data storage services to one or more clients 502 through a network 530. Network 530 can be, for example, a local area network (LAN), wide area network (WAN), metropolitan area network (MAN), global area network such as the Internet, a Fibre Channel fabric, or any combination of such interconnects. Each of clients 502 can be, for example, a conventional personal computer (PC), server-class computer, workstation, handheld computing or communication device, or other special or general purpose computer.

Storage of data in storage units 550 is managed by storage servers 510 which receive and respond to various read and write requests from clients 502, directed to data stored in or to be stored in storage units 550. Storage units 550 constitute mass storage devices which can include, for example, flash memory, magnetic or optical disks, or tape drives, illustrated as disks 552 (disk 552A, 552B). Storage devices 552 can further be organized into arrays (not illustrated) implementing a Redundant Array of Inexpensive Disks/Devices (RAID) scheme, whereby storage servers 510 access storage units 550 using one or more RAID protocols known in the art.

Storage servers 510 can provide file-level service such as used in a network-attached storage (NAS) environment, block-level service such as used in a storage area network (SAN) environment, a service which is capable of providing both file-level and block-level service, or any other service capable of providing other data access services. Although storage servers 510 are each illustrated as single units in FIG. 5A, a storage server can, in other embodiments, constitute a separate network element or module (an "N-module") and disk element or module (a "D-module"). In one embodiment, the D-module includes storage access components for servicing client requests. In contrast, the N-module includes functionality that enables client access to storage access components (e.g., the D-module), and the N-module can include protocol components, such as Common Internet File System (CIFS), Network File System (NFS), or an Internet Protocol (IP) module, for facilitating such connectivity. Details of a distributed architecture environment involving D-modules and N-modules are described further below with respect to FIG. 5B and embodiments of a D-module and an N-module are described further below with respect to FIG. 7.

In one embodiment, storage servers 510 are referred to as network storage subsystems. A network storage subsystem provides networked storage services for a specific application or purpose, and can be implemented with a collection of networked resources provided across multiple storage servers and/or storage units.

In the embodiment of FIG. 5A, one of the storage servers (e.g., storage server 510A) functions as a primary provider of data storage services to client 502. Data storage requests from client 502 are serviced using disks 552A organized as one or more storage objects. A secondary storage server (e.g., storage server 510B) takes a standby role in a mirror relationship with the primary storage server, replicating storage objects from the primary storage server to storage objects organized on disks of the secondary storage server (e.g., disks 550B). In operation, the secondary storage server does not service requests from client 502 until data in the primary storage object becomes inaccessible such as in a disaster with the primary storage server, such event considered a failure at the primary storage server. Upon a failure at the primary storage server, requests from client 502 intended for the primary storage object are serviced using replicated data (i.e. the secondary storage object) at the secondary storage server.

It will be appreciated that in other embodiments, network storage system 500 can include more than two storage servers. In these cases, protection relationships can be operative between various storage servers in system 500 such that one or more primary storage objects from storage server 510A can be replicated to a storage server other than storage server 510B (not shown in this figure). Secondary storage objects can further implement protection relationships with other storage objects such that the secondary storage objects are replicated, e.g., to tertiary storage objects, to protect against failures with secondary storage objects. Accordingly, the description of a single-tier protection relationship between primary and secondary storage objects of storage servers 510 should be taken as illustrative only.

In one embodiment, storage devices 550 include respective local controllers 580 (controller 580A, 580B). The local controller receives a write request and determines if an erase command can be performed concurrently with a write command to service the write request. If the erase and write can be performed concurrently, controller 580 generates a write command to service or fulfill the write request on one media access channel, and generates an erase command to erase blocks marked for deletion on another media access channel. The write operation and the erase operation are directed to different locations on the physical media.

Figure 5B:
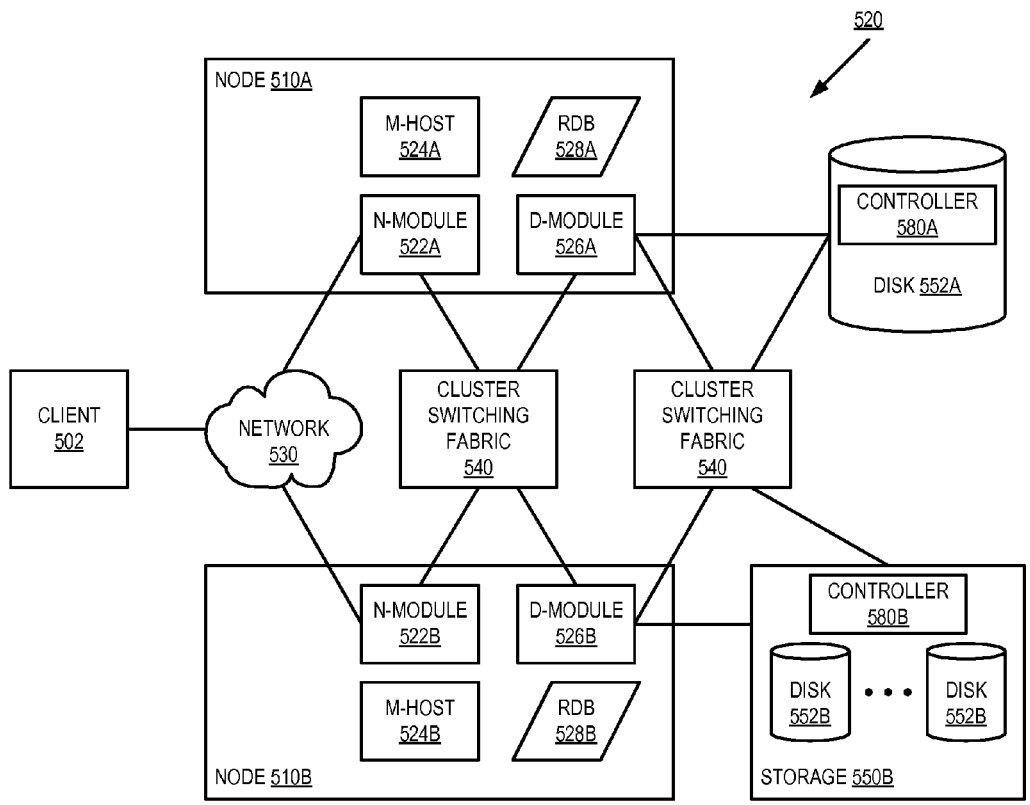
FIG. 5B illustrates a distributed or clustered architecture for a network storage system in which concurrent write and erase can be implemented in an alternative embodiment.

FIG. 5B illustrates a distributed or clustered architecture for a network storage system in which concurrent write and erase can be implemented in an alternative embodiment. System 520 can include storage servers implemented as nodes 510 (nodes 510A, 510B) which are each configured to provide access to storage devices 552. In FIG. 5B, nodes 510 are interconnected by a cluster switching fabric 540, which can be embodied as an Ethernet switch.

Nodes 510 can be operative as multiple functional components that cooperate to provide a distributed architecture of system 520. To that end, each node 510 can be organized as a network element or module (N-module 522A, 522B), a disk element or module (D-module 526A, 526B), and a management element or module (M-host 524A, 524B). In one embodiment, each module includes a processor and memory for carrying out respective module operations. For example, N-module 522 can include functionality that enables node 510 to connect to client 502 via network 530 and can include protocol components such as a media access layer, Internet Protocol (IP) layer, Transport Control Protocol (TCP) layer, User Datagram Protocol (UDP) layer, and other protocols known in the art.

In contrast, D-module 526 can connect to one or more storage devices 552 via cluster switching fabric 540 and can be operative to service access requests on devices 550. In one embodiment, the D-module 526 includes storage access components such as a storage abstraction layer supporting multi-protocol data access (e.g., Common Internet File System protocol, the Network File System protocol, and the Hypertext Transfer Protocol), a storage layer implementing storage protocols (e.g., RAID protocol), and a driver layer implementing storage device protocols (e.g., Small Computer Systems Interface protocol) for carrying out operations in support of storage access operations. In the embodiment shown in FIG. 5B, a storage abstraction layer (e.g., file system) of the D-module divides the physical storage of devices 550 into storage objects. Requests received by node 510 (e.g., via N-module 522) can thus include storage object identifiers to indicate a storage object on which to carry out the request.

Also operative in node 510 is M-host 524 which provides cluster services for node 510 by performing operations in support of a distributed storage system image, for instance, across system 520. M-host 524 provides cluster services by managing a data structure such as a relational database (RDB) 528 (RDB 528A, 528B) which contains information used by N-module 522 to determine which D-module 526 "owns" (services) each storage object. The various instances of RDB 528 across respective nodes 510 can be updated regularly by M-host 524 using conventional protocols operative between each of the M-hosts (e.g., across network 530) to bring them into synchronization with each other. A client request received by N-module 522 can then be routed to the appropriate D-module 526 for servicing to provide a distributed storage system image.

Similar to what is described above, storage devices 550 and/or 552 of system 520 include respective local controllers 580 (controller 580A, 580B). Typically each storage device includes a separate local controller 580, although controller 580B is shown within storage 550B which includes multiple disks 552B. The local controller receives a write request and determines if an erase command can be performed concurrently with a write command to service the write request. If the erase and write can be performed concurrently, controller 580 generates a write command to service or fulfill the write request on one media access channel, and generates an erase command to erase blocks marked for deletion on another media access channel. The write operation and the erase operation are directed to different locations on the physical media.

It will be noted that while FIG. 5B shows an equal number of N- and D-modules constituting a node in the illustrative system, there can be different number of N- and D-modules constituting a node in accordance with various embodiments. For example, there can be a number of N-modules and D-modules of node 510A that does not reflect a one-to-one correspondence between the N- and D-modules of node 510B. As such, the description of a node comprising one N-module and one D-module for each node should be taken as illustrative only.

Figure 6:
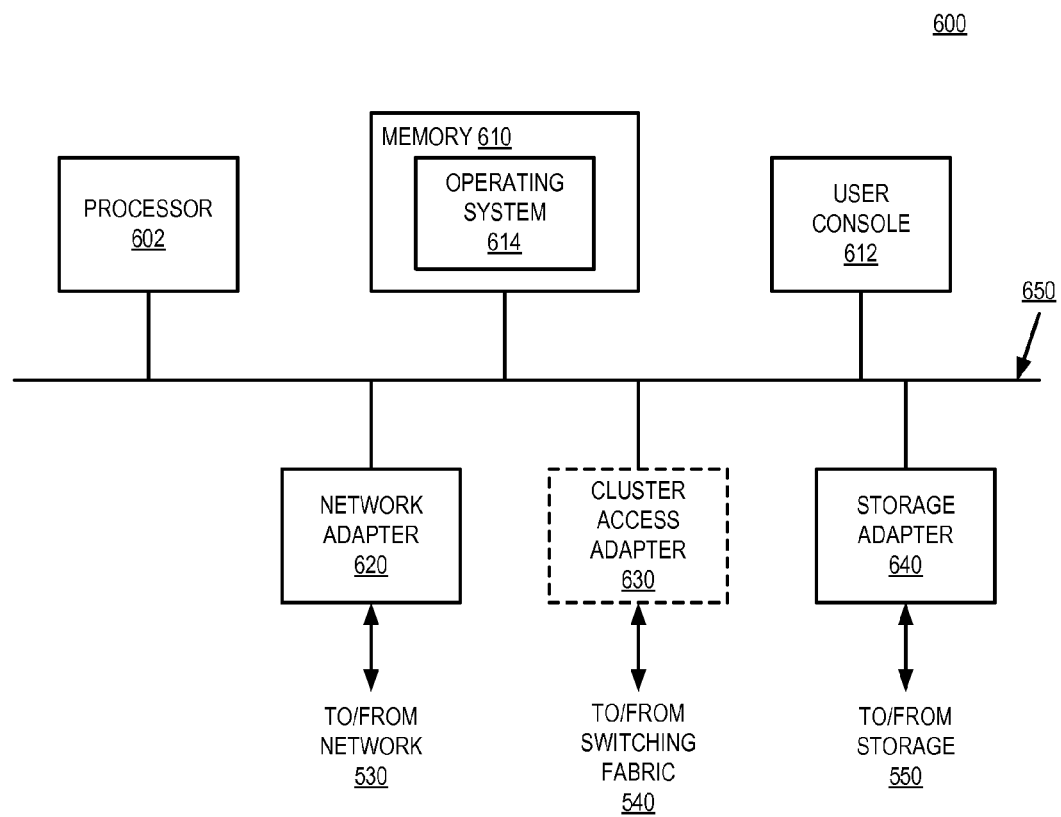
FIG. 6 is a block diagram of an illustrative embodiment of an environment of FIGS. 5A and 5B in which concurrent write and erase can be implemented.

FIG. 6 is a block diagram of an illustrative embodiment of an environment of FIGS. 5A and 5B in which concurrent write and erase can be implemented. As illustrated, the storage server is embodied as a general or special purpose computer 600 including a processor 602, a memory 610, a network adapter 620, a user console 612 and a storage adapter 640 interconnected by a system bus 650, such as a convention Peripheral Component Interconnect (PCI) bus.

Memory 610 includes storage locations addressable by processor 602, network adapter 620 and storage adapter 640 for storing processor-executable instructions and data structures associated with a multi-tiered cache with a virtual storage appliance. A storage operating system 614, portions of which are typically resident in memory 610 and executed by processor 602, functionally organizes the storage server by invoking operations in support of the storage services provided by the storage server. It will be apparent to those skilled in the art that other processing means can be used for executing instructions and other memory means, including various computer readable media, can be used for storing program instructions pertaining to the technology described herein. It will also be apparent that some or all of the functionality of the processor 602 and executable software can be implemented by hardware, such as integrated currents configured as programmable logic arrays, ASICs, and the like.

Network adapter 620 comprises one or more ports to couple the storage server to one or more clients over point-to-point links or a network. Thus, network adapter 620 includes the mechanical, electrical and signaling circuitry needed to couple the storage server to one or more client over a network. Each client can communicate with the storage server over the network by exchanging discrete frames or packets of data according to pre-defined protocols, such as TCP/IP.

Storage adapter 640 includes a plurality of ports having input/output (I/O) interface circuitry to couple the storage devices (e.g., disks) to bus 650 over an I/O interconnect arrangement, such as a conventional high-performance, FC or SAS (Serial-Attached SCSI (Small Computer System Interface)) link topology. Storage adapter 640 typically includes a device controller (not illustrated) comprising a processor and a memory for controlling the overall operation of the storage units in accordance with read and write commands received from storage operating system 614. As used herein, data written by a device controller in response to a write command is referred to as "write data," whereas data read by device controller responsive to a read command is referred to as "read data."

User console 612 enables an administrator to interface with the storage server to invoke operations and provide inputs to the storage server using a command line interface (CLI) or a graphical user interface (GUI). In one embodiment, user console 612 is implemented using a monitor and keyboard.

Computing device 600 includes storage adapter 640 to interface with storage devices that include respective local controllers (such as controllers 580). The local controller receives a write request and determines if an erase command can be performed concurrently with a write command to service the write request. If the erase and write can be performed concurrently, the local controller generates a write command to service or fulfill the write request on one media access channel, and generates an erase command to erase blocks marked for deletion on another media access channel. The write operation and the erase operation are directed to different locations on the physical media.

When implemented as a node of a cluster, such as cluster 520 of FIG. 5B, the storage server further includes a cluster access adapter 630 (shown in phantom) having one or more ports to couple the node to other nodes in a cluster. In one embodiment, Ethernet is used as the clustering protocol and interconnect media, although it will be apparent to one of skill in the art that other types of protocols and interconnects can by utilized within the cluster architecture.

Figure 7:
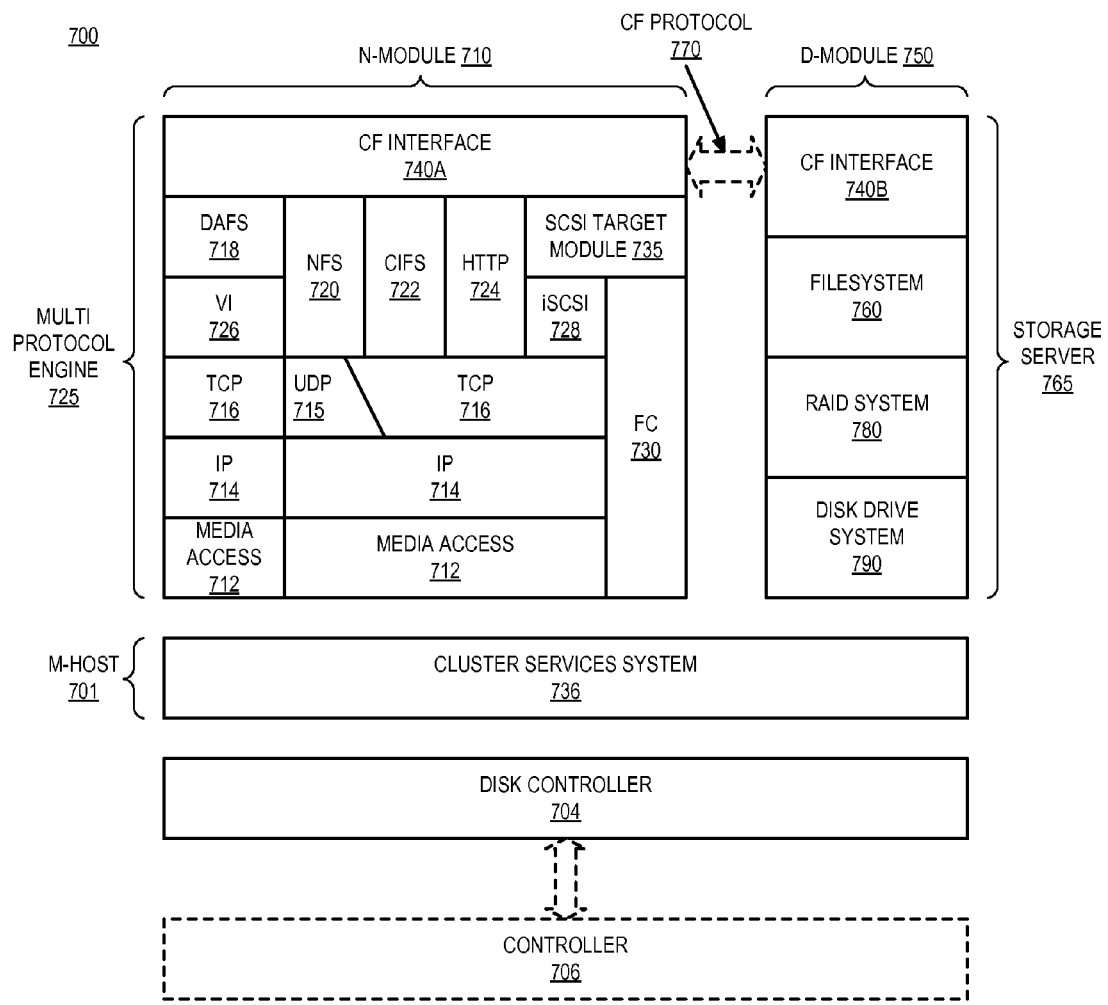
FIG. 7 illustrates an embodiment of the storage operating system of FIG. 6 for which a concurrent write and erase can be implemented.

FIG. 7 illustrates an embodiment of the storage operating system of FIG. 6 for which a concurrent write and erase can be implemented. The storage operating system can be an example of storage system 600, and the storage operating system can be an example of storage operating system 614 of FIG. 6. The storage operating system includes software layers executed by a processor, such as processor 602 of FIG. 6, and organized to form an integrated network protocol stack or, more generally, a multi-protocol engine 725 that provides data paths for clients to access information stored on the storage server using block and file access protocols.

Multi-protocol engine 725 includes a media access layer 712 of network drivers (e.g., gigabit Ethernet drivers) that interface with network protocol layers, such as the IP layer 714 and its supporting transport mechanisms, the TCP layer 716 and the User Datagram Protocol (UDP) layer 715. The different instances of access layer 712, IP layer 714, and TCP layer 716 are associated with two different protocol paths or stacks. A file system protocol layer provides multi-protocol file access and, to that end, includes support for the Direct Access File System (DAFS) protocol 718, the NFS protocol 720, the CIFS protocol 722 and the Hypertext Transfer Protocol (HTTP) protocol 724. A VI (virtual interface) layer 726 implements the VI architecture to provide direct access transport (DAT) capabilities, such as RDMA, as required by the DAFS protocol 718. An iSCSI driver layer 728 provides block protocol access over the TCP/IP network protocol layers, while a FC driver layer 730 receives and transmits block access requests and responses to and from the storage server. In certain cases, a Fibre Channel over Ethernet (FCoE) layer (not shown) can also be operative in multi-protocol engine 725 to receive and transmit requests and responses to and from the storage server. The FC and iSCSI drivers provide respective FC- and iSCSI-specific access control to the blocks and, thus, manage exports of luns (logical unit numbers) to either iSCSI or FCP or, alternatively, to both iSCSI and FCP when accessing blocks on the storage server.

The storage operating system also includes a series of software layers organized to form a storage server 765 that provides data paths for accessing information stored on storage devices. Information can include data received from a client, in addition to data accessed by the storage operating system in support of storage server operations such as program application data or other system data. Preferably, client data can be organized as one or more logical storage objects (e.g., volumes) that comprise a collection of storage devices cooperating to define an overall logical arrangement. In one embodiment, the logical arrangement can involve logical volume block number (vbn) spaces, wherein each volume is associated with a unique vbn.

File system 760 implements a virtualization system of the storage operating system through the interaction with one or more virtualization modules (illustrated as a SCSI target module 735). SCSI target module 735 is generally disposed between drivers 728, 730 and file system 760 to provide a translation layer between the block (lun) space and the file system space, where luns are represented as blocks. In one embodiment, file system 760 implements a WAFL (write anywhere file layout) file system having an on-disk format representation that is block-based using, e.g., 4 kilobyte (KB) blocks and using a data structure such as index nodes or indirection nodes ("inodes") to identify files and file attributes (such as creation time, access permissions, size and block location). File system 760 uses files to store metadata describing the layout of its file system, including an inode file, which directly or indirectly references (points to) the underlying data blocks of a file.

Operationally, a request from a client is forwarded as a packet over the network and onto the storage server where it is received at a network adapter. A network driver such as layer 712 or layer 730 processes the packet and, if appropriate, passes it on to a network protocol and file access layer for additional processing prior to forwarding to file system 760. There, file system 760 generates operations to load (retrieve) the requested data from the disks if it is not resident "in core", i.e., in memory 610. If the information is not in memory, file system 760 accesses the inode file to retrieve a logical vbn and passes a message structure including the logical vbn to the RAID system 780. There, the logical vbn is mapped to a disk identifier and device block number (disk, dbn) and sent to an appropriate driver of disk driver system 790. The disk driver accesses the dbn from the specified disk and loads the requested data block(s) in memory for processing by the storage server. Upon completion of the request, the node (and operating system 700) returns a reply to the client over the network.

It will be understood that the software "path" through the storage operating system layers described above can alternatively be implemented in hardware. Thus, any path needed to perform data storage access for a client request received at the storage server can be implemented in hardware and/or software. A storage access request data path can be implemented as logic circuitry embodied within a field programmable gate array (FPGA) or an application specific integrated circuit (ASIC). Such a hardware embodiment increases the performance of the storage service provided by the storage server in response to a request issued by a client. Moreover, in another alternate embodiment, the processing elements of adapters 620, 640 can be configured to offload some or all of the packet processing and storage access operations, respectively, from processor 602, to increase the performance of the storage service provided by the storage server. It is expressly contemplated that the various processes, architectures and procedures described herein can be implemented in hardware, firmware, and/or software.

When implemented in a cluster, data access components of the storage operating system can be embodied as D-module 750 for accessing data stored on disk. In contrast, multiprotocol engine 725 can be embodied as N-module 710 to perform protocol termination with respect to a client issuing incoming access over the network, as well as to redirect the access requests to any other N-module in the cluster. A cluster services system 736 can further implement an M-host (e.g., M-host 701) to provide cluster services for generating information sharing operations to present a distributed file system image for the cluster. For instance, media access layer 712 can send and receive information packets between the various cluster services systems of the nodes to synchronize the replicated databases in each of the nodes.

In addition, a cluster fabric (CF) interface module 740 (CF interface modules 740A, 740B) can facilitate intra-cluster communication between N-module 710 and D-module 750 using a CF protocol 770. For instance, D-module 750 can expose a CF application programming interface (API) to which N-module 710 (or another D-module not shown) issues calls. To that end, CF interface module 740 can be organized as a CF encoder/decoder using local procedure calls (LPCs) and remote procedure calls (RPCs) to communicate a file system command between D-modules residing on the same node and remote nodes, respectively.

In one embodiment, disk drive system 790 includes disk controller 704, which is shown separately for simplicity in description. Disk controller 704 interfaces operating system 700 with one or more storage devices. The storage devices each include a local controller 706. The local controller receives a write request and determines if an erase command can be performed concurrently with a write command to service the write request. If the erase and write can be performed concurrently, controller 706 generates a write command to service or fulfill the write request on one media access channel, and generates an erase command to erase blocks marked for deletion on another media access channel. The write operation and the erase operation are directed to different locations on the physical media.

As used herein, the term "storage operating system" generally refers to the computer-executable code operable on a computer to perform a storage function that manages data access and can implement data access semantics of a general purpose operating system. The storage operating system can also be implemented as a microkernel, an application program operating over a general-purpose operating system, or as a general-purpose operating system with configurable functionality, which is configured for storage applications as described herein.

As used herein, instantiation refers to creating an instance or a copy of a source object or source code. The source code can be a class, model, or template, and the instance is a copy that includes at least some overlap of a set of attributes, which can have different configuration or settings than the source. Additionally, modification of an instance can occur independent of modification of the source.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

Various operations or functions are described herein, which can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communications interface to send data via the communications interface. A machine readable medium or computer readable medium can cause a machine to perform the functions or operations described, and includes any mechanism that provides (i.e., stores and/or transmits) information in a form accessible by a machine (e.g., computing device, electronic system, or other device), such as via recordable/non-recordable storage media (e.g., read only memory (ROM), random access memory (RAM), magnetic disk storage media, optical storage media, flash memory devices, or other storage media) or via transmission media (e.g., optical, digital, electrical, acoustic signals or other propagated signal). A communication interface includes any mechanism that interfaces to any of a hardwired, wireless, optical, or other medium to communicate to another device, such as a memory bus interface, a processor bus interface, an Internet connection, a disk controller. The communication interface can be configured by providing configuration parameters and/or sending signals to prepare the communication interface to provide a data signal describing the software content.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations without departing from their scope. Therefore, the illustrations and examples herein should be construed in an illustrative, and not a restrictive sense.

What is claimed is:

1. A method comprising:
receiving a first request to write data to a physical medium of a storage device that requires erasing previously written blocks prior to writing new data to the previously written blocks;
determining that one or more blocks are marked for deletion; and
in response to receiving the first request and determining that one or more blocks are marked for deletion,
issuing, on a first media access channel, a first write command to write the data to a first location on the physical medium; and
issuing, on a second media access channel, a first erase command for a second location on the physical medium, wherein the second location is different from the first location, wherein the first write command and the first erase command are issued in parallel.

2. The method of claim 1, wherein the physical medium comprises a solid state drive storage device.

3. The method of claim 1 further comprising, in response to receiving a second request and determining that one or more additional blocks are marked for deletion, issuing, on a third media access channel, a second write command to write data to a third location on the physical medium and issuing, on a fourth media access channel, a second erase command for a fourth location on the physical medium.

4. The method of claim 1, wherein the first erase command is issued in response to receiving the first request and not in response to an erase command issued by a disk controller that manages the storage device.

5. The method of claim 1 further comprising:
determining that the data is edited data;
reading original data corresponding to the edited data from the storage device;
modifying the original data;
wherein the first write command comprises a command to write the modified data to a location different from the location of the original data; and
marking the original data for deletion.

6. The method of claim 1 further comprising:
receiving a second request to write data to the physical medium;
determining that one or more additional blocks are marked for deletion;
determining that there are insufficient available free blocks to service the second request;
issuing a second erase command to erase the additional blocks marked for deletion; and
issuing a second write command to write data to the physical medium at an address of the additional blocks after completion of the second erase command.

7. A storage device comprising:
a storage array configured to store data, wherein the storage array requires erasing previously written blocks prior to writing new data to the previously written blocks;
a hardware interface to exchange data with a device controller, the hardware interface configured to receive, from the device controller, a first request to write data to the storage array; and
a local controller configured to,
determine that one or more blocks are marked for deletion; and
in response to receiving the first request and determining that one or more blocks are marked for deletion, issue, on a first media access channel, a first write command to write the data to a first location on the storage array, and issue, on a second media access channel, a first erase command for a second location on the storage array, wherein the second location is different from the first location, wherein the first write command and the first erase command are issued in parallel.

8. The storage device of claim 7, wherein the storage array comprises a solid state storage medium.

9. The storage device of claim 7 further comprising the local controller being configured to, in response to receiving a second request and determining that one or more additional blocks are marked for deletion, issue, on a third media access channel, a second write command to write data to a third location on the storage array and issue, on a fourth media access channel, a second erase command for a fourth location on the storage array.

10. The storage device of claim 7, wherein the first erase command is issued in response to receiving the first request and not in response to an erase command issued by the device controller.

11. The storage device of claim 7 further comprising the local controller being configured to:
determine that the data is edited data;
read original data corresponding to the edited data from the storage device;
modify the original data;
wherein the first write command comprises a command to write the modified data to a location different from the location of the original data; and
mark the original data for deletion.

12. The storage device of claim 7 further comprising the local controller being configured to:
determine that one or more additional blocks are marked for deletion in response to a second request;
determine that there are insufficient available free blocks to service the second request;
issue a second erase command to erase the additional blocks marked for deletion; and
issue a second write command to write data to the storage array at an address of the additional blocks after completion of the second erase command.

13. An article of manufacture comprising a computer-readable storage medium having program code stored thereon, the program code to:
receive a first request to write data to a physical medium of a storage device that requires erasing previously written blocks prior to writing new data to the previously written blocks;
determine that one or more blocks are marked for deletion; and
in response to receiving the first request and determining that one or more blocks are marked for deletion,
issue, on a first media access channel, a first write command to write the data to a first location on the physical medium; and
issue, on a second media access channel, a first erase command for a second location on the physical medium, wherein the second location is different from the first location, wherein the first write command and the first erase command are issued in parallel.

14. The article of manufacture of claim 13, wherein the physical medium comprises a solid state drive storage device.

15. The article of manufacture of claim 13, wherein the program code further comprises program code to, in response to receiving a second request and determining that one or more additional blocks are marked for deletion, issue, on a third media access channel, a second write command to write data to a third location on the physical medium and issue, on a fourth media access channel, a second erase command for a fourth location on the physical medium.

16. The article of manufacture of claim 13, wherein the first erase command is issued in response to receiving the first request and not in response to an erase command issued by a disk controller that manages the storage device.

17. The article of manufacture of claim 13, wherein the program code further comprises program code to:
   determine that the data is edited data;
   read original data corresponding to the edited data from the storage device;
   modify the original data;
   wherein the first write command comprises a command to write the modified data to a location different from the location of the original data; and
   mark the original data for deletion.

18. The article of manufacture of claim 13, wherein the program code further comprises program code to:
   receive a second request to write data to the physical medium;
   determine that one or more additional blocks are marked for deletion;
   determine that there are insufficient available free blocks to service the second request;
   issue a second erase command to erase the additional blocks marked for deletion; and
   issue a second write command to write data to the physical medium at an address of the additional blocks after completion of the second erase command.

* * * * *